US008742857B2

(12) United States Patent  (10) Patent No.: US 8,742,857 B2
Martchovsky et al.  (45) Date of Patent: Jun. 3, 2014

(54) INDUCTANCE ENHANCED ROTARY TRAVELING WAVE OSCILLATOR CIRCUIT AND METHOD

(75) Inventors: Andrey Martchovsky, Fremont, CA (US); Stephen Beccue, Thousand Oaks, CA (US); Anh Pham, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 60 days.

(21) Appl. No.: 13/341,995

(22) Filed: Dec. 31, 2011

(65) Prior Publication Data

US 2012/0319783 A1  Dec. 20, 2012

Related U.S. Application Data

(63) Continuation-in-part of application No. 12/465,890, filed on May 14, 2009, now Pat. No. 8,089,322.

(60) Provisional application No. 61/053,637, filed on May 15, 2008.

(51) Int. Cl.
  *H03B 5/18* (2006.01)
(52) U.S. Cl.
  CPC .......... *H03B 5/18* (2013.01); *H03B 2200/0016* (2013.01); *H03B 2200/0024* (2013.01)
  USPC ........................... 331/96; 331/99; 331/107 DP
(58) Field of Classification Search
  USPC ............ 331/96, 99, 107 DP, 107 SL, 57, 135; 333/219, 236
  See application file for complete search history.

(56) References Cited

U.S. PATENT DOCUMENTS

| 4,686,407 A | 8/1987 | Ceperley |
| 4,749,963 A | 6/1988 | Makimoto et al. |
| 5,302,920 A | 4/1994 | Bitting |
| 5,584,067 A | 12/1996 | Buer et al. |
| 5,592,126 A | 1/1997 | Boudewijns et al. |

(Continued)

FOREIGN PATENT DOCUMENTS

| EP | 0696843 | 2/1996 |
| GB | 2 349 524 | 11/2000 |
| WO | WO 01/67603 | 9/2001 |
| WO | WO 2009-140585 | 11/2009 |

OTHER PUBLICATIONS

Wood et al., *Rotary Traveling-Wave Oscillator Arrays: A New Clock Technology*, IEEE Journal of Solid-State Circuits, Nov. 2001, vol. 36, No. 11, pp. 1654-1665.

(Continued)

*Primary Examiner* — Ryan Johnson
(74) *Attorney, Agent, or Firm* — Knobbe, Martens, Olson & Bear, LLP

(57) ABSTRACT

A plurality of inductance enhanced interweaved rotary traveling wave oscillators (RTWO) is disclosed. Portions of the transmission line conductors are increased in length and run in parallel. Because the currents in these portions travel in the same direction, the inductance of these inductors is increased. By controlling the length of the transmission line conductors in these areas compared to the lengths where the currents in the oscillators travel in opposite directions, the overall impedance of the oscillators can be increased. Increased impedance leads to lower power and lower phase noise for the oscillators. Additionally, the interweaved oscillators are phase-locked to each other.

20 Claims, 18 Drawing Sheets

(56) References Cited

U.S. PATENT DOCUMENTS

| | | |
|---|---|---|
| 5,652,549 A | 7/1997 | Unterricker et al. |
| 5,825,211 A | 10/1998 | Smith et al. |
| 6,002,274 A | 12/1999 | Smith et al. |
| 6,150,886 A | 11/2000 | Shimomura |
| 6,157,037 A | 12/2000 | Danielson |
| 6,259,747 B1 | 7/2001 | Gustafsson et al. |
| 6,281,759 B1 | 8/2001 | Coffey |
| 6,323,737 B1 | 11/2001 | Broekaert |
| 6,396,359 B1 | 5/2002 | Hajimiri et al. |
| 6,426,662 B1 | 7/2002 | Arcus |
| 6,525,618 B2 | 2/2003 | Wood |
| 6,556,089 B2 | 4/2003 | Wood |
| 6,566,968 B2 | 5/2003 | Afghahi |
| 6,781,424 B2 | 8/2004 | Lee et al. |
| 6,856,208 B2 | 2/2005 | Lee et al. |
| 6,870,431 B2 | 3/2005 | Afghahi |
| 6,900,699 B1 | 5/2005 | Kim |
| 6,943,599 B2 | 9/2005 | Ngo |
| 6,995,620 B2 | 2/2006 | Afghahi |
| 7,005,930 B1 | 2/2006 | Kim et al. |
| 7,085,668 B2 | 8/2006 | Johnson |
| 7,088,154 B2 | 8/2006 | Ngo |
| 7,091,802 B2 | 8/2006 | Ham et al. |
| 7,130,604 B1 | 10/2006 | Wong et al. |
| 7,218,180 B2 | 5/2007 | Wood |
| 7,224,199 B1 | 5/2007 | Kang |
| 7,224,235 B2 | 5/2007 | De Ranter et al. |
| 7,236,060 B2 * | 6/2007 | Wood .................. 331/57 |
| 7,242,272 B2 | 7/2007 | Ham et al. |
| 7,274,262 B2 | 9/2007 | Ham et al. |
| 7,295,076 B2 | 11/2007 | Kim et al. |
| 7,307,483 B2 | 12/2007 | Tzartzanis et al. |
| 7,315,219 B2 | 1/2008 | Chiang |
| 7,339,439 B2 | 3/2008 | Roubadia et al. |
| 7,378,893 B1 | 5/2008 | Kang |
| 7,397,230 B2 | 7/2008 | Tabaian et al. |
| 7,409,012 B2 | 8/2008 | Martin et al. |
| 7,446,578 B2 | 11/2008 | Huang |
| 7,471,153 B2 | 12/2008 | Kee et al. |
| 7,482,884 B2 | 1/2009 | Wang et al. |
| 7,504,895 B2 | 3/2009 | Neidorff |
| 7,511,588 B2 | 3/2009 | Gabara |
| 7,513,873 B2 | 4/2009 | Shifrin |
| 7,515,005 B2 | 4/2009 | Dan |
| 7,541,794 B2 | 6/2009 | Tabaian et al. |
| 7,551,038 B2 | 6/2009 | Jang et al. |
| 7,571,337 B1 | 8/2009 | Zhai et al. |
| 7,577,225 B2 | 8/2009 | Azadet et al. |
| 7,609,756 B2 | 10/2009 | Wood |
| 7,612,621 B2 | 11/2009 | Kim et al. |
| 7,616,070 B2 | 11/2009 | Tzartzanis et al. |
| 7,656,239 B2 | 2/2010 | Bietti et al. |
| 7,656,336 B2 | 2/2010 | Wood |
| 7,656,979 B2 | 2/2010 | Leydier et al. |
| 7,663,328 B2 | 2/2010 | Gonder |
| 7,715,143 B2 | 5/2010 | Bliss et al. |
| 7,741,921 B2 | 6/2010 | Ismailov |
| 7,782,988 B2 | 8/2010 | Ziesler |
| 7,833,158 B2 | 11/2010 | Bartz |
| 7,847,643 B2 | 12/2010 | Da Dalt |
| 7,885,625 B2 | 2/2011 | Muhammad et al. |
| 7,893,778 B2 | 2/2011 | Mohtashemi et al. |
| 7,907,023 B2 | 3/2011 | Liang et al. |
| 7,911,284 B2 | 3/2011 | Kuwano |
| 7,924,076 B2 | 4/2011 | Suzuki et al. |
| 7,936,193 B2 | 5/2011 | Van Der Wel et al. |
| 7,944,316 B2 | 5/2011 | Watanabe et al. |
| 7,952,439 B1 | 5/2011 | Heggemeier et al. |
| 7,973,609 B2 | 7/2011 | Ohara et al. |
| 7,995,364 B2 | 8/2011 | Shiu |
| 8,008,981 B2 | 8/2011 | Hong et al. |
| 8,049,563 B2 | 11/2011 | Aoki et al. |
| 8,089,322 B2 | 1/2012 | Beccue et al. |
| 2002/0196089 A1 | 12/2002 | Wood |
| 2003/0006851 A1 | 1/2003 | Wood |
| 2004/0240126 A1 | 12/2004 | Tiemeijer |
| 2005/0068116 A1 | 3/2005 | Ham et al. |
| 2005/0068146 A1 | 3/2005 | Jessie |
| 2005/0156680 A1 | 7/2005 | Wood |
| 2006/0208776 A1 | 9/2006 | Tonietto et al. |
| 2008/0074202 A1 | 3/2008 | Gabara |
| 2009/0322394 A1 | 12/2009 | Song et al. |
| 2010/0117744 A1 | 5/2010 | Takinami et al. |
| 2010/0156549 A1 | 6/2010 | Uemura et al. |
| 2010/0321121 A1 | 12/2010 | Mohtashemi |
| 2011/0095833 A1 | 4/2011 | Mohtashemi et al. |
| 2011/0156760 A1 | 6/2011 | Bhuiyan et al. |
| 2011/0156773 A1 | 6/2011 | Beccue |
| 2011/0195683 A1 | 8/2011 | Brekelmans et al. |
| 2011/0286510 A1 | 11/2011 | Levantino et al. |
| 2012/0008717 A1 | 1/2012 | van Sinderen et al. |
| 2012/0013363 A1 | 1/2012 | Takinami et al. |
| 2012/0013407 A1 | 1/2012 | Takinami et al. |
| 2012/0025918 A1 | 2/2012 | Wang et al. |

OTHER PUBLICATIONS

Le Grand de Mercey, *18GHz Rotary Traveling Wave Voltage Conrolle Oscillator in a CMOS Technology PhD Thesis*, Universtat der Bundeswehr Munchen, Aug. 3, 2004.

Jun-Chau and Liang-Hung Lu, *A 32-GHz Rotary Traveling-Wave Voltage Controlled Oscillator in 0.18-um CMOS, IEEE Microwave and Wireless Components Letters*, Oct. 2007, vol. 17, No. 10, pp. 724-726.

International Preliminary Report on Patentability and Written Opinion of the International Searching Authority in PCT application No. PCT/US2009/044114, dated Jan. 14, 2010.

Detcheverry et al., *The effect of copper design rules on inductor performance*, Phillips Research Laboratories, Sep. 16, 2003.

Kleveland, et al., *50 GHz Interconnect Design in Standard Silicon Technology*, Center For Integrated Systems, Standford University, Stanford, CA, 1998 IEEE MSS-S Digest.

Kleveland et al., *Line Inductance Extraction and Modeling in a Real Chip with a Power Grid*, Center for Integrated Systems, Standford University, Stanford, CA, 1999 IEEE.

Kral et al., *RF-CMOS Oscillators with Switched Tuning*, IEEE 1998 Custom Integrated Circuits Conference.

Lee et al., *A 40Gb/s Clock and Data Recovery Circuit in 0.18 um CMOS Technology*, 2003 IEEE International Solid-State Circuits Conference.

Reatti, et al., *Solid and Litz-Wire Winding Non-linear Resistance Comparision*, Proc. 43rd IEEE Midwest Sump. On Circuits and Systems, Lansing, MI, Aug. 8, 2000 IEEE.

*Integrated CMOS Transmit-Receive Switch Using On-Chip Spiral Inductors*, Phd dissertation, Stanford University, Talwalkar, Dec. 2003.

*Modeling and Design of Planar Integrated Magnetic Components*, MSEE dissertation, Wang, Shen Virginia Polytechnic Institute, Jul. 21, 2003.

Yabuki et al., *Miniature Stripline Dual-mod Ring Resonators and Their Application to Oscillating Devices*, 1995 IEEE MSS-S Digest, 1995 IEEE.

*On-chip Spiral Inductors with Patterned Ground Shields for Si-Based RF IC's*, Cetner For Integrated Systems, Stanford University, Stanford, CA. IEEE Journal of Solid State Circuits, vol. 33, No. 5, May 1998.

International Search Report and Written Opinion of the International Searching Authority in PCT application No. PCT/US2012/068016, dated Mar. 11, 2013, 9 pages.

* cited by examiner

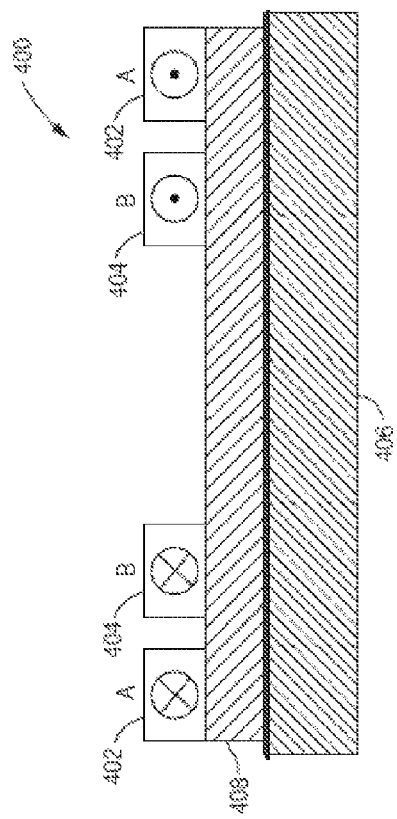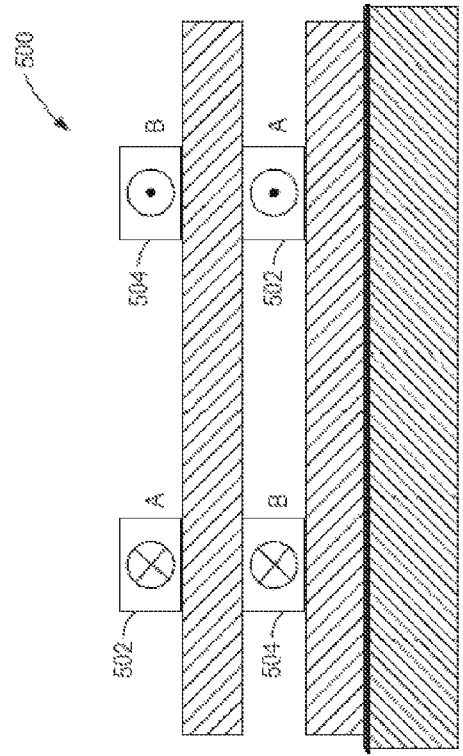

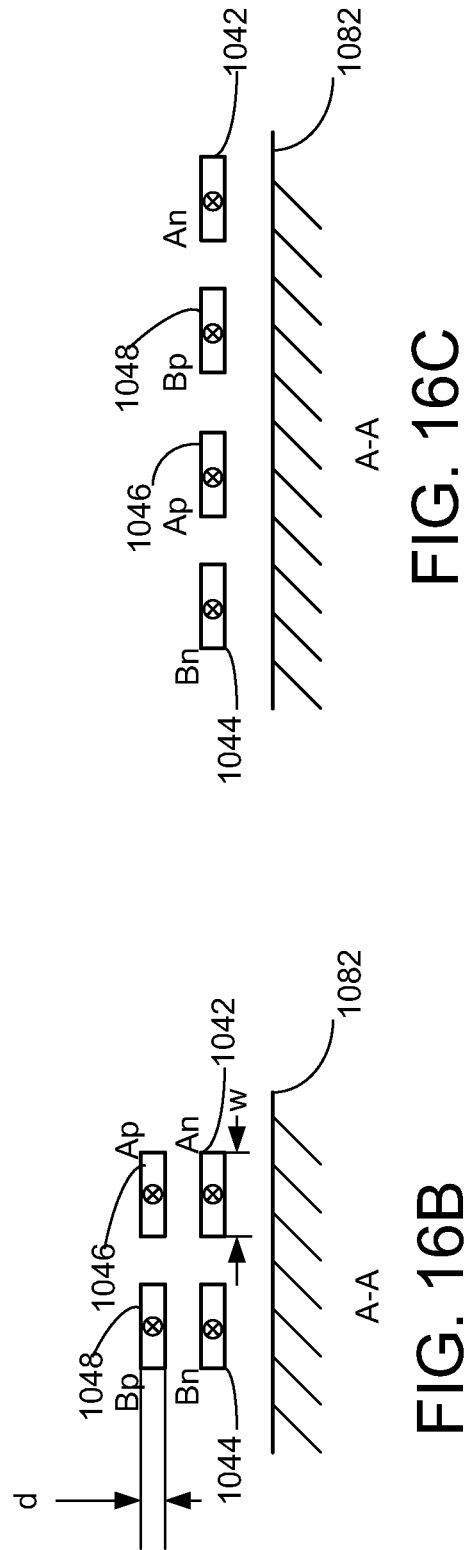

INDUCTANCE ENHANCED ROTARY TRAVELING WAVE OSCILLATOR CIRCUIT AND METHOD

CROSS-REFERENCE TO RELATED APPLICATIONS

This application incorporates by reference and claims the benefit of U.S. application Ser. No. 12/465,890, titled "INDUCTANCE ENHANCED ROTARY TRAVELING WAVE OSCILLATOR CIRCUIT AND METHOD", filed on May 14, 2009, which application claims priority to and incorporates by reference U.S. Provisional Application 61/053,637, filed on May 15, 2008, titled "INDUCTANCE ENHANCED ROTARY TRAVELING WAVE OSCILLATOR CIRCUIT AND METHOD."

FIELD OF THE INVENTION

The present invention relates generally to rotary traveling wave oscillators and more particularly to an inductance-enhanced version of such oscillators. Additionally, the invention relates to improvements to inductors.

DESCRIPTION OF THE RELATED ART

Rotary traveling wave oscillators (RTWO) are described in U.S. Pat. No. 6,556,089, which is hereby incorporated by reference in its entirety. FIG. 1 shows the general arrangement of the oscillator, which includes a pair of conductors acting as a transmission line, an odd number of phase-reversing elements, such as cross-overs, connected to the conductors, and a plurality of regeneration elements. In FIG. 1, the transmission line includes conductors 15a and 15b and one cross-over, 19, an odd number of cross-overs being needed to maintain oscillations on the transmission line. FIG. 1 also shows a plurality of regeneration elements 21, connected at spaced apart positions along the transmission line and between the conductors 15a and 15b of the line. The regeneration elements establish a traveling wave on the line and maintain the wave by supplying energy to the line to make up for small losses.

FIG. 2 illustrates one embodiment of a regeneration element, a pair of cross-coupled CMOS inverters. The p-channel transistor of each inverter is connected between a first potential, VDD, and a conductor of the transmission line. The n-channel transistor of each inverter is connected between that same conductor of the transmission line and a second potential, VSS. In each inverter, the input to the gates of both transistors is the other conductor of the transmission line, thereby cross-coupling the inverters. As a wave travels past them, the cross-coupled inverters switch, supplying energy to the wave to maintain its amplitude. As long as a regeneration element exhibits negative resistance, it can perform the function of starting and maintaining a traveling wave on the line. For example, the regeneration devices of U.S. Pat. No. 7,545,225 can perform the needed function.

FIG. 3 shows one way to connect a regeneration element to the line. Such a connection biases the direction of rotation of the wave, because the wave arrives at the gates of the inverters before it arrives at their drains, as described in U.S. Pat. No. 7,218,180, which is hereby incorporated by reference in its entirety. This gives the cross-coupled inverters the time they need to switch just as the wave arrives at their outputs. Because the switching is carefully timed, the regeneration element does not appreciably disturb the period of the oscillator, thereby resulting in low phase noise.

FIG. 4 shows a folded rotary clock, which is described in the U.S. Pat. No. 7,218,180. The folded rotary clock has six folds and one cross-over. As described in the '180 patent, the folds have the advantage of providing a convenient way of making connections to the regeneration element to bias the wave in a particular direction.

FIG. 5 shows in detail the connection of a regeneration element on a folded line so that the traveling wave is biased to travel in a particular direction. Note that the time for a wave to reach the drain of an inverter after it reaches the gate is determined by the length of the fold. In the inset 86 shown, the wave arrives at location 100, the gate of inverter 94, before it arrives at location 102, the drain of inverter 94. This arrangement thus allows for the length of the fold to be tailored the delay of the inverter.

BRIEF SUMMARY OF THE INVENTION

One embodiment of the present invention is interleaved rotary traveling wave oscillators. The interleaved oscillators include a first rotary traveling wave oscillator and a second rotary traveling wave oscillator. The first rotary traveling wave oscillator (RTWO) includes a first pair of conductors and a first crossover, with the first pair connected with the first crossover to form a first closed loop. The second rotary traveling wave oscillator (RTWO) includes a second pair of conductors and a second crossover, with the second pair of conductors connected with the second cross over to form a second closed loop. The second closed loop occupies approximately the same physical area as the first closed loop; and the conductors of the first and second crossovers are spaced apart and parallel to each other over a sufficient length that the inductance of the crossovers is increased.

One advantage of the present invention is that the power needed to operate the oscillator is decreased.

Another advantage is that the phase noise is improved.

Yet another advantage is that interleaved oscillators are naturally phase-locked.

Yet another advantage is that the area required for multiple oscillators is not substantially increased over that required for a single oscillator.

BRIEF DESCRIPTION OF THE DRAWINGS

These and other features, aspects and advantages of the present invention will become better understood with regard to the following description, appended claims, and accompanying drawings where:

FIG. 8 shows a cross-section of the embodiment of FIG. 6;

FIG. 9 shows a cross-section of the embodiment in FIG. 7;

FIG. 16B shows a first way of placing the conductors in proximity; and FIG. 16C shows a second way of placing the conductors in proximity.

DETAILED DESCRIPTION OF THE INVENTION

Figure 6:
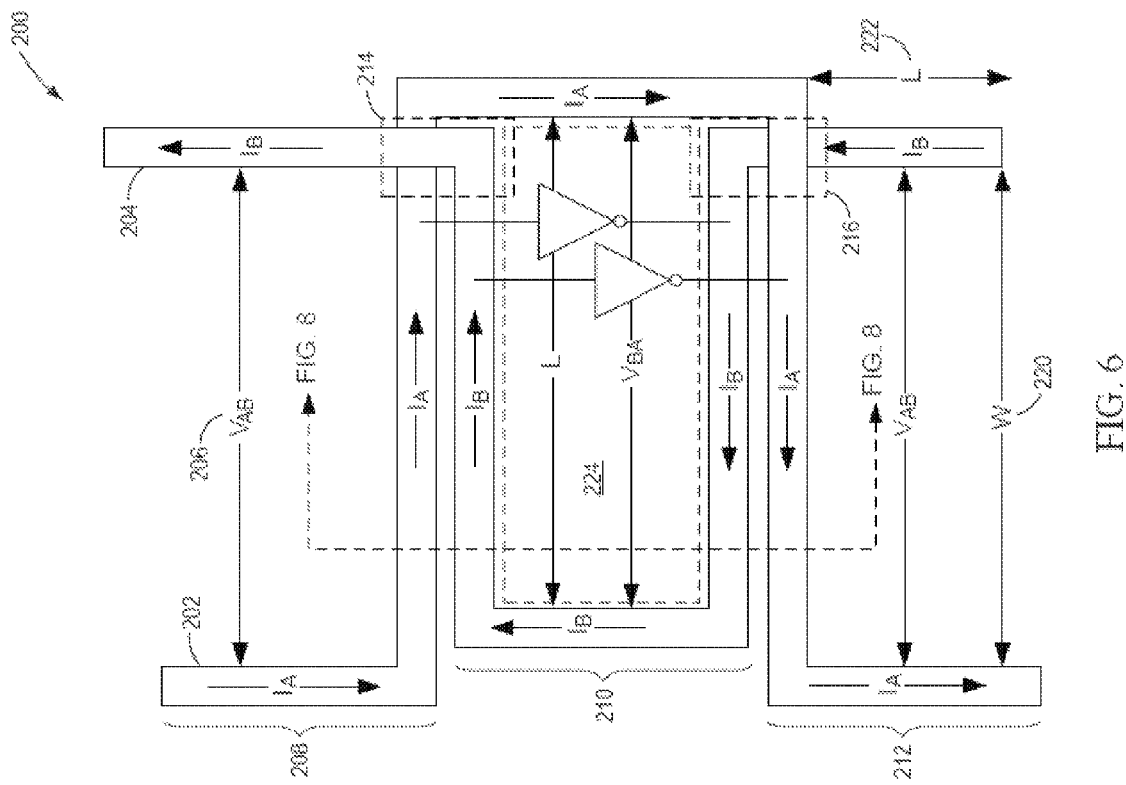
FIG. 6 shows an embodiment of the present invention.

FIG. 6 shows an embodiment 200 of the present invention. In this embodiment, a portion 202 of a pair of transmission line conductors of a rotary traveling wave oscillator carries the traveling wave. Current $I_A$ flows in one conductor A 202 and current $I_B$ flows in the other conductor B 204. A voltage $V_{AB}$ 206 is present between the two conductors, where conductor A is assumed to be more positive on the upper section 208 of the line, where conductor B is more positive in the middle section 210 of the line, and where conductor A is more positive again on the bottom section 212. Therefore, the portion of transmission line depicted includes two cross-overs. One cross-over 214 reverses the polarity of the wave between section 208 and section 210 and the other cross-over 216 reverses the polarity of the wave between section 210 and 212. Instead of minimizing the coupling between the conductors crossover each other, as suggested in the U.S. Pat. No. 6,556,089 patent, the cross-overs in the present invention attempt to maximize the coupling between the conductors, so much so that the cross-overs constitute a major portion of the length of the transmission line. In fact, in the present invention the goal is to make the length of the horizontal runs W 220 depicted much longer than the vertical runs L 222. In one embodiment, the W/L ratio is approximately 3. However, this ratio is a design parameter that is selected to achieve a desired impedance as well as a gate-offset delay for the regeneration elements. An advantage of forming the loop with horizontal and vertical runs is that it is more compact, a significantly longer length of transmission line fitting into a smaller area.

Figure 1:
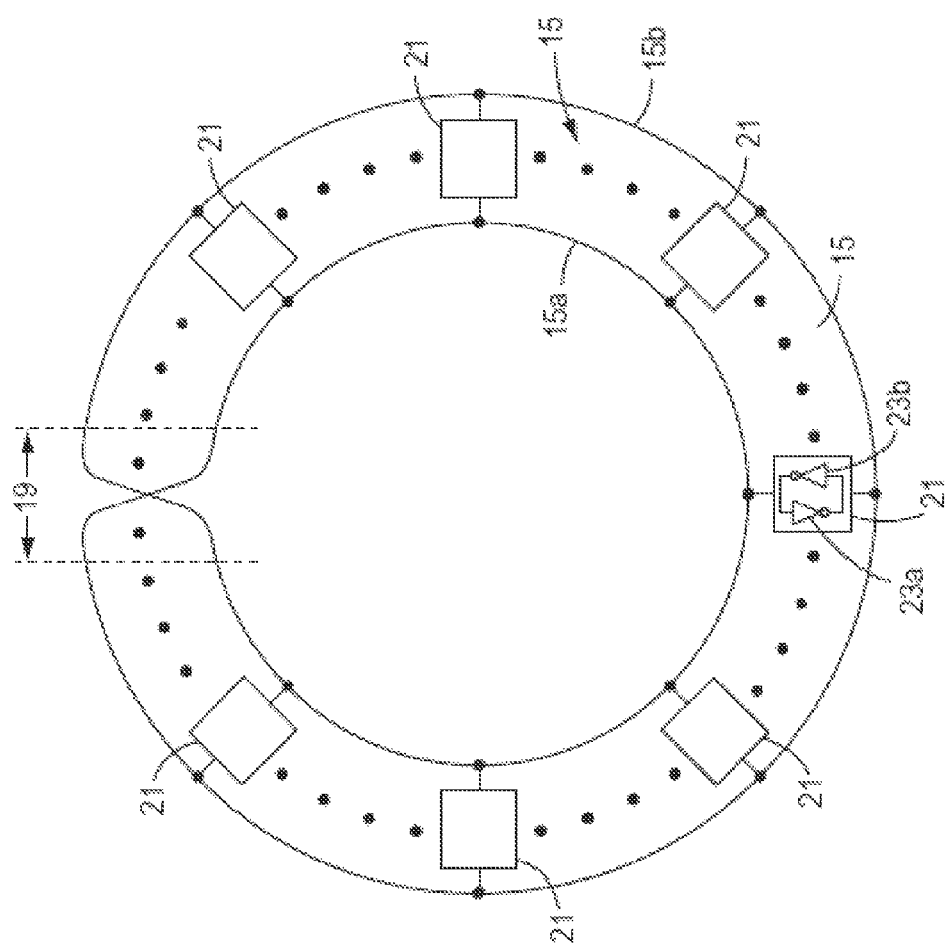
FIG. 1 shows the general arrangement of a rotary traveling wave oscillator.
Figure 2:
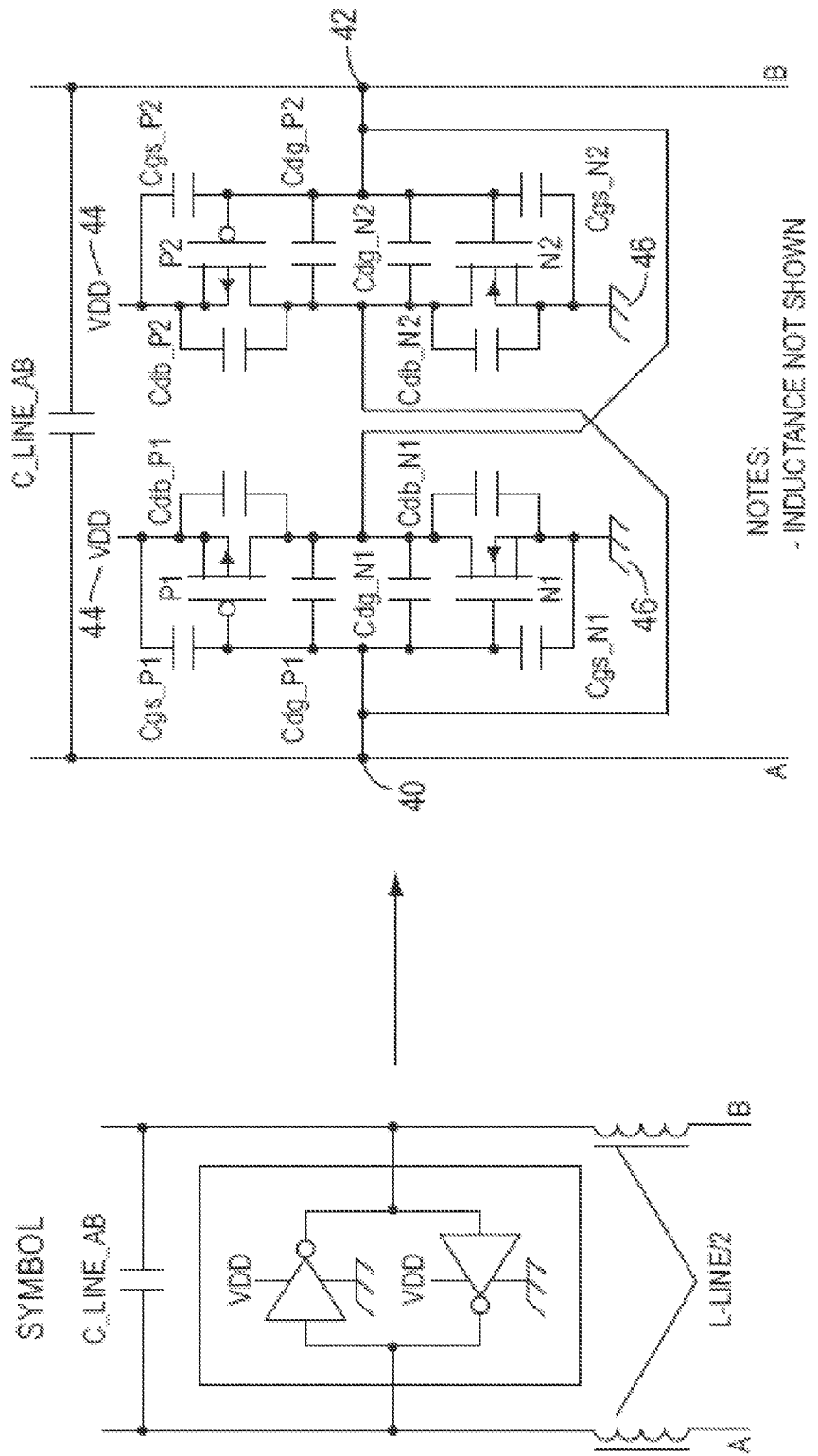
FIG. 2 illustrates one embodiment of a regeneration device, that of a pair of cross-coupled inverters.
Figure 3:
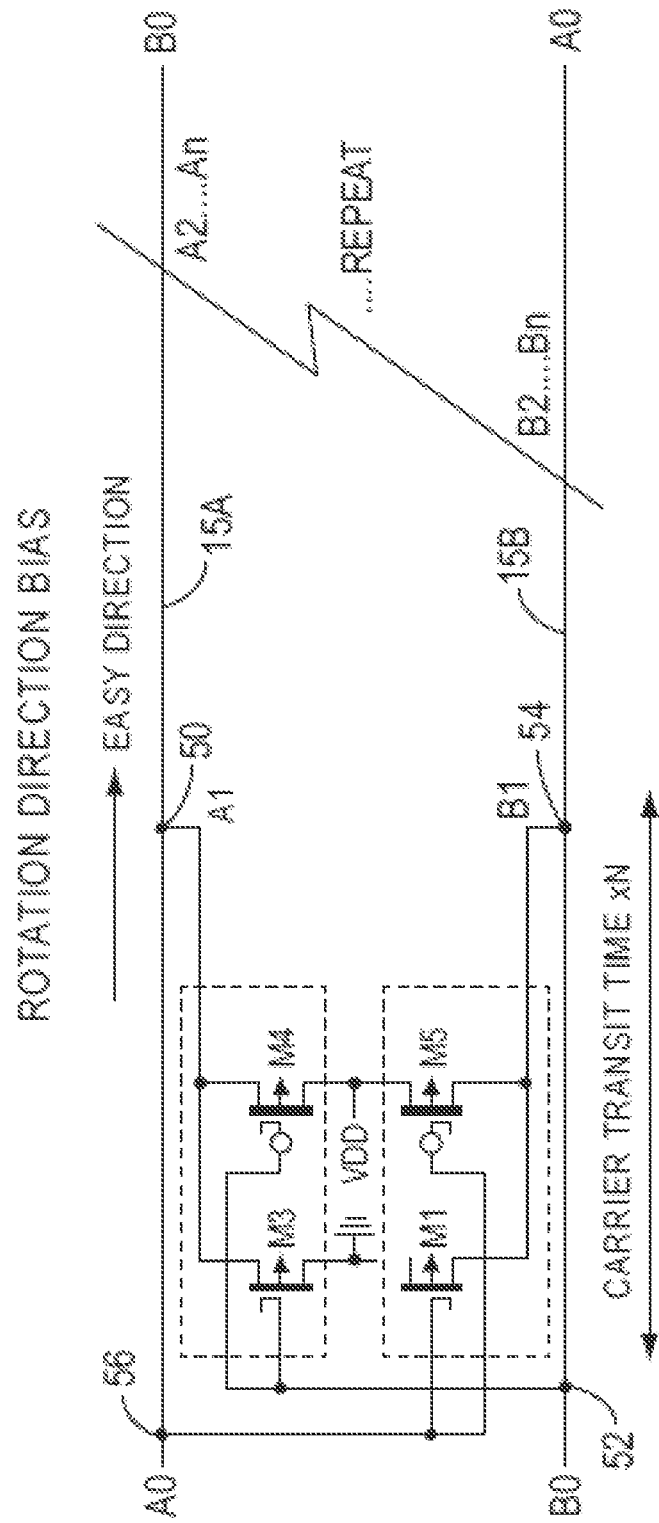
FIG. 3 shows one way to connect a regeneration device to the line.
Figure 4:
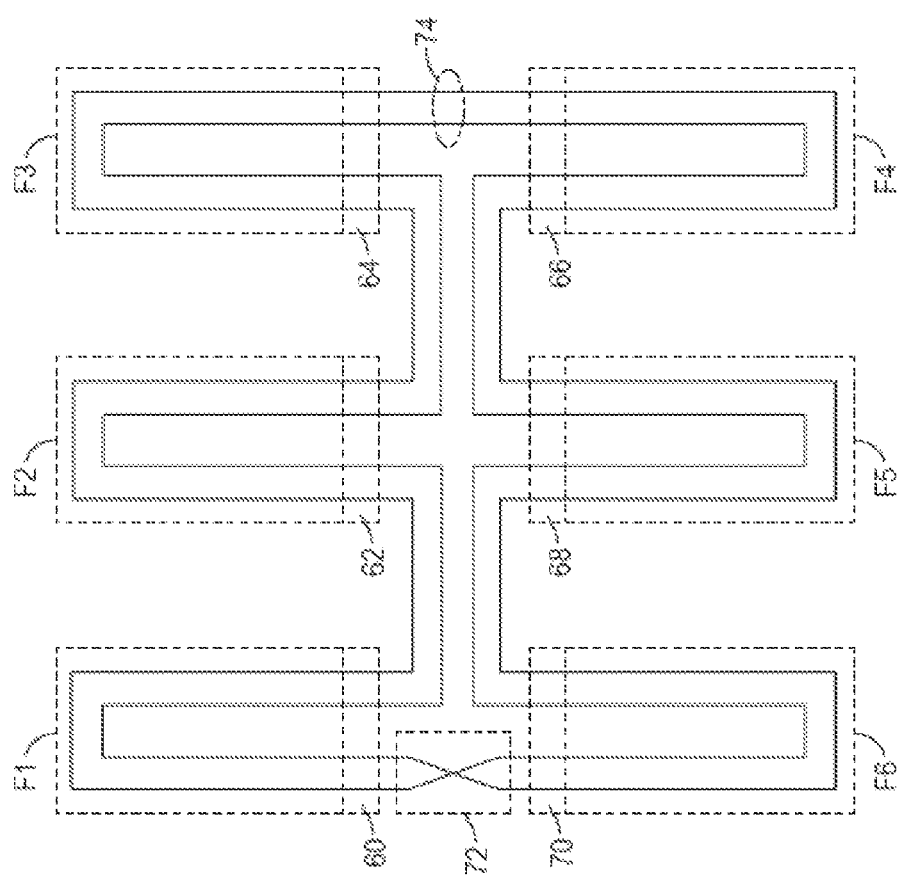
FIG. 4 shows a folded rotary clock as described in the U.S. Pat. No. 7,218,180.
Figure 5:
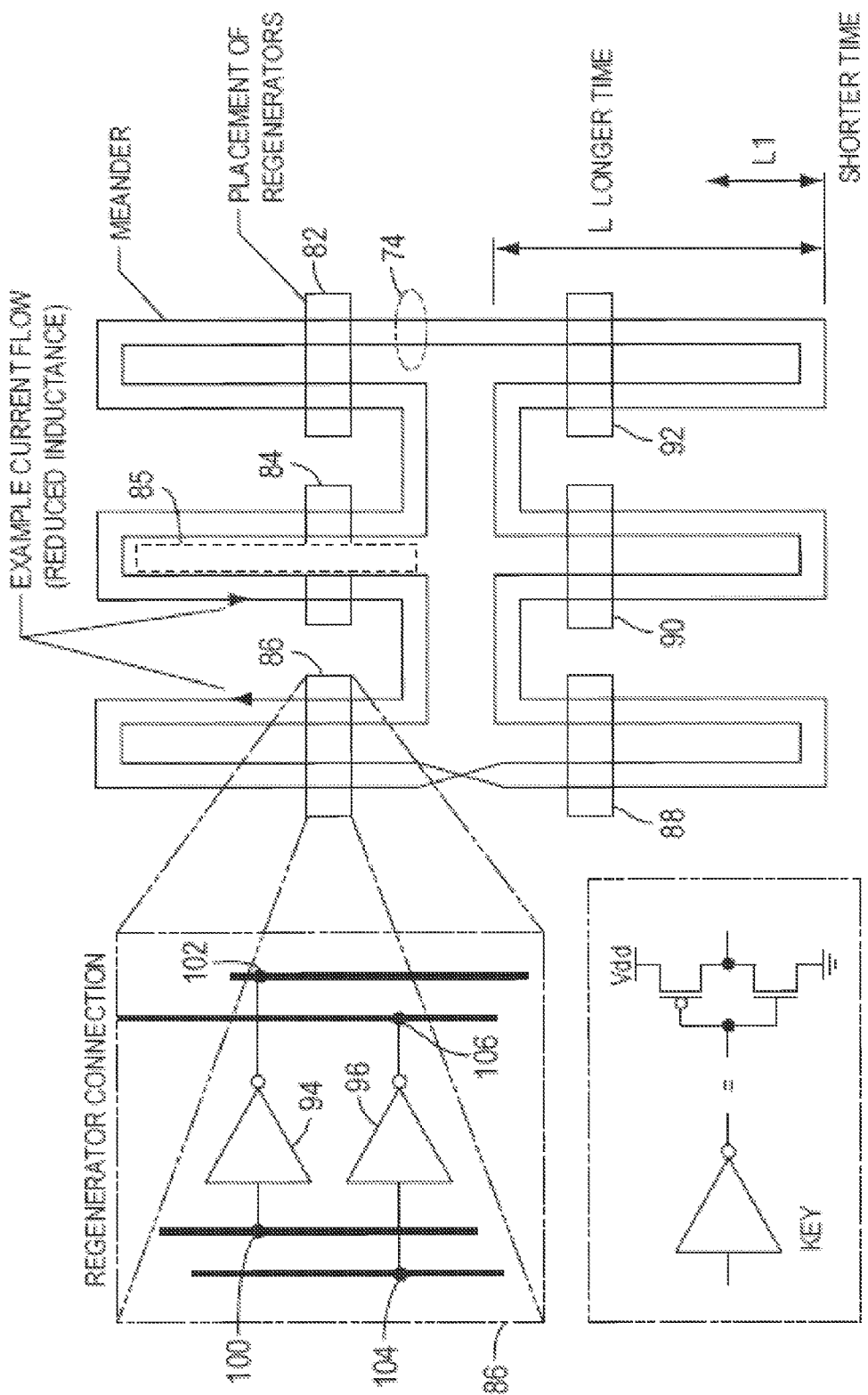
FIG. 5 shows in detail the connection of a regeneration element on a folded line to bias a wave for travel in a particular direction.

An important property of the embodiment illustrated in FIG. 6 is that the magnetic flux 1 over the area 224 is four times that over the area 85 of the fold shown in FIG. 5. The reason is that the currents surrounding the area are twice as great, with approximately equal currents $I_A$ and $I_B$ adding in the adjacent horizontal conductors of sections 208 and 212. Therefore, the embodiment increases the inductance of the conductors by four times.

Increasing the inductance of the transmission line leads to an increase in the impedance of the line according to the relationship $Z_0 = \sqrt{L/C}$, where L is the differential inductance per unit length and C is the differential capacitance per unit length of line. For example, increasing the inductance by a factor of four and holding the capacitance unaltered, increases the impedance by a factor of two. The higher impedance of the line has some very positive effects. One benefit is that the power of a wave on the line is reduced by a factor of two, because half as much current is needed for a given differential voltage between the conductors. Another effect is that the phase noise is improved by about 3 dB, which is equivalent to twofold improvement. The phase noise improvement stems from an improvement in the Q factor ($Q = \omega L/R$). Specifically, due to the inductance enhancements, the inductance per unit length increases by about a factor of four, but the series resistance of the line doubles. This causes a doubling in the Q, and thus a lowering of the phase noise. If a figure of merit for oscillators can be defined as the product of the power and phase noise, then the change in the figure of merit for the embodiment of FIG. 5 is about fourfold, about the same as the inductance increase.

FIG. 8 shows a cross-section 400 of the embodiment of FIG. 6. The conductors A 402 and B 404 are shown as separated from a ground plane 406 by any convenient and suitable insulator 408, depending on whether the lines are implemented on a PC board or an integrated circuit.

Figure 7:
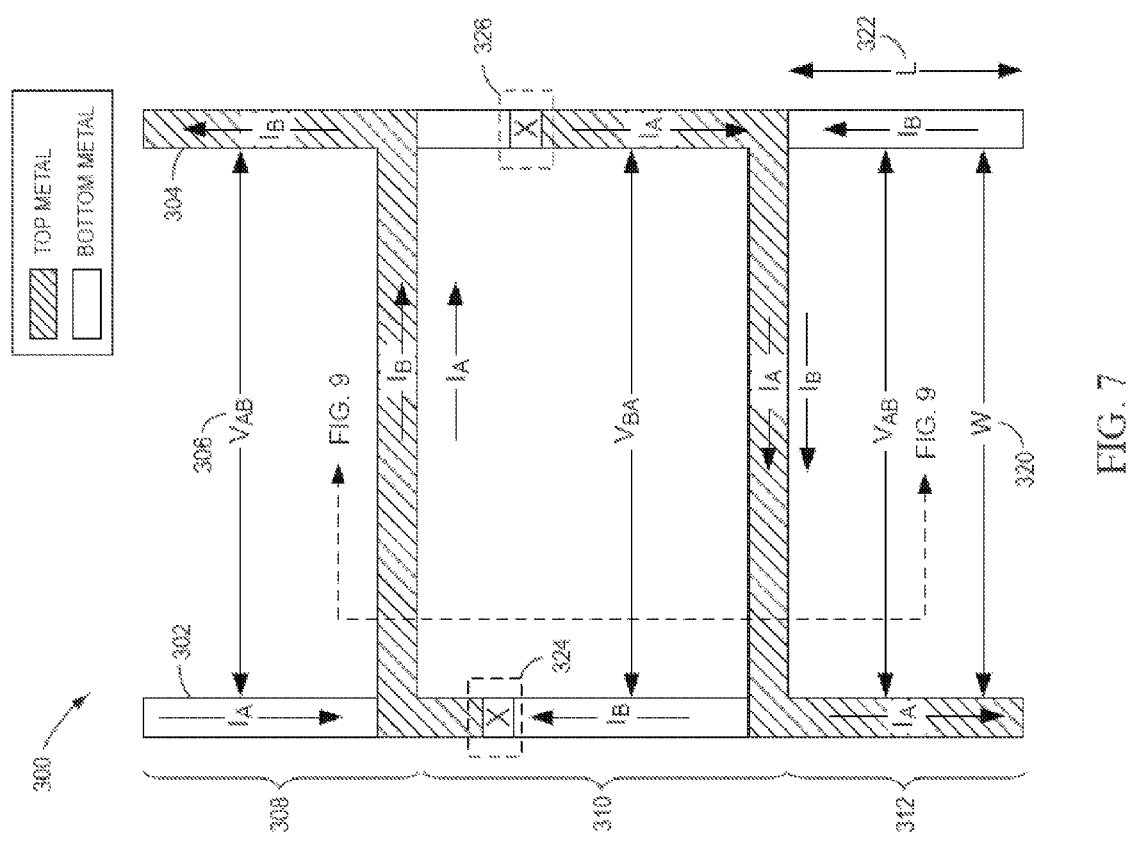
FIG. 7 shows a second embodiment of the present invention.

FIG. 7 shows a second embodiment 300 of the present invention. In this embodiment, the horizontal runs of the A and B conductors stacked on top of each other and a crossover is implemented by one or more feedthroughs or vias 324, 326 between the top metal and the bottom metal. Thus, the conductor with current $I_A$ flows on the left and under the conductor with current $I_B$ in section 308 and the conductor with $I_A$ on the right flows on the top of the conductor with $I_B$ in section 310.

FIG. 9 shows a cross-section of the embodiment in FIG. 7. In this embodiment, the A conductor on the left is disposed over an insulator, which is, in turn, disposed over the B conductor. The B conductor on the right is similarly disposed over the A conductor. In both cases, the conductors are insulated from the ground plane with a suitable insulator.

Figure 10A:
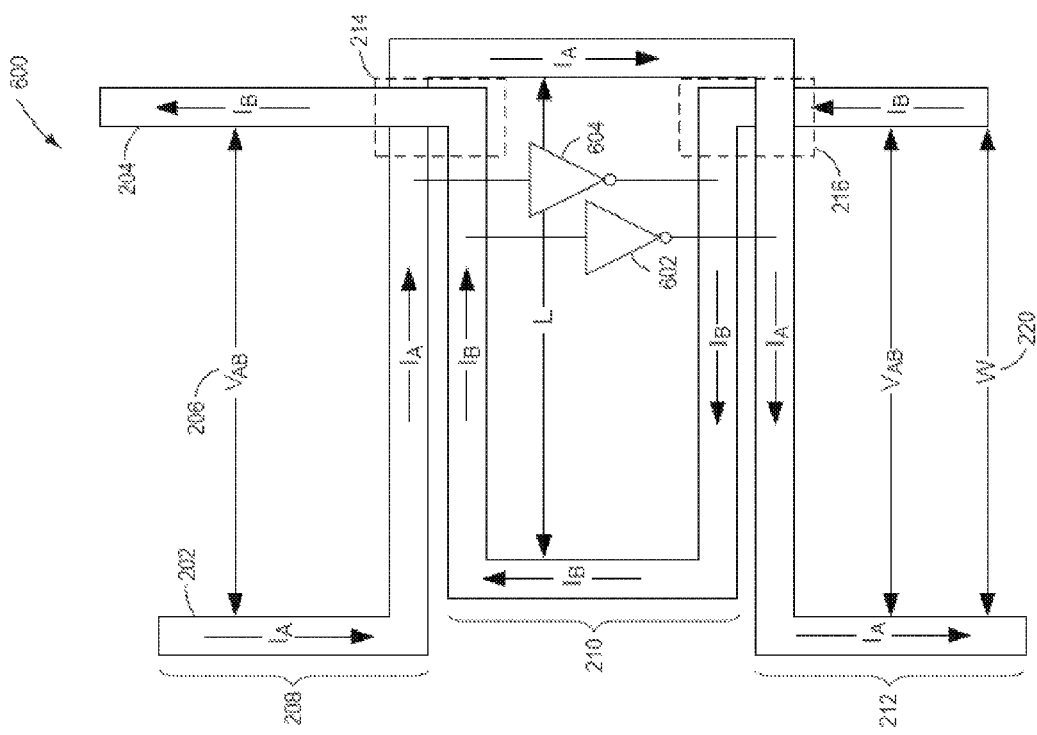
FIG. 10 shows the placement of representative regeneration elements for the embodiment of FIG. 6.
Figure 10B:
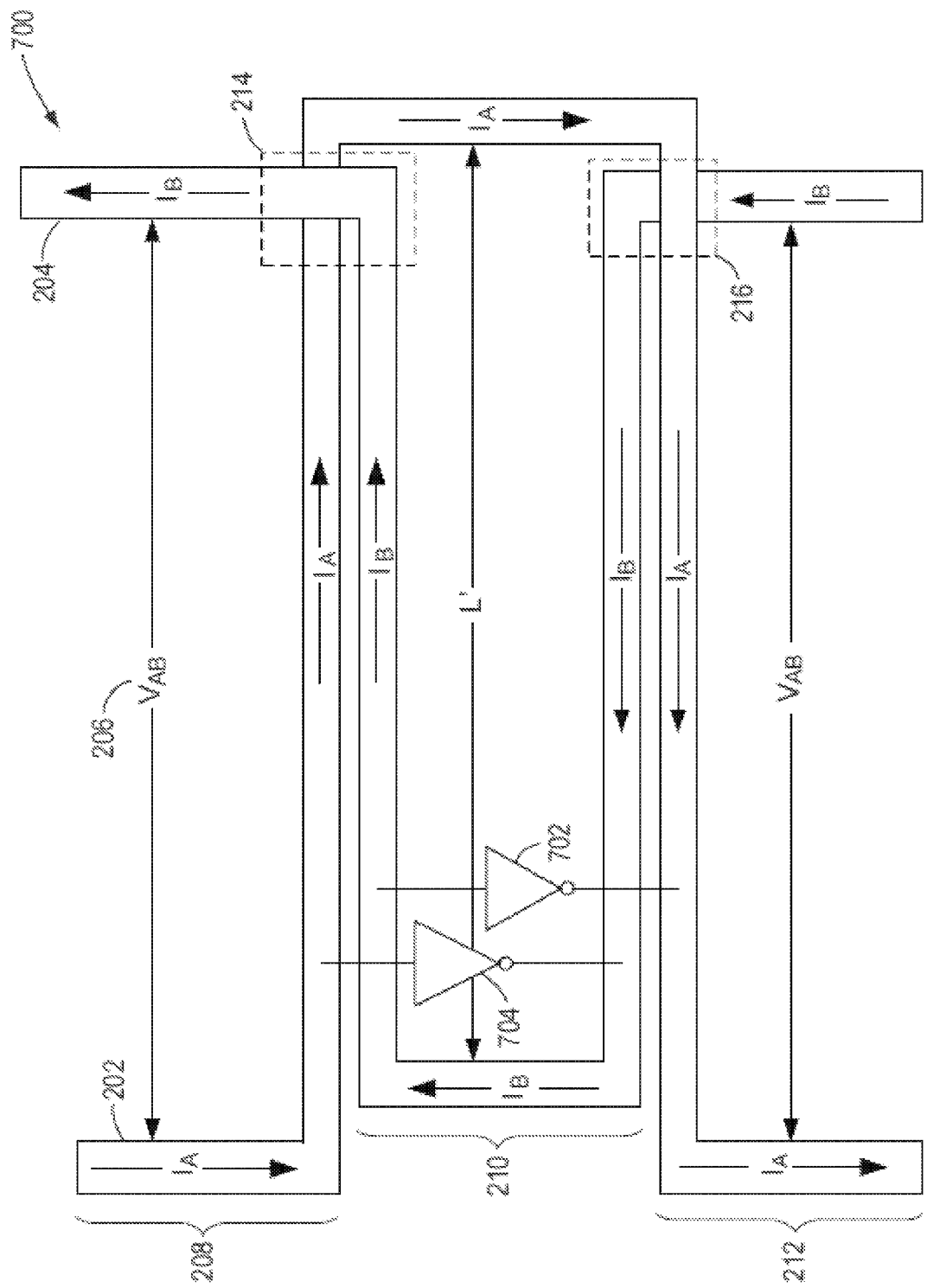

FIG. 10A shows the placement of representative regeneration elements for the embodiment of FIG. 6. As is clear from the figure, the regeneration elements 602, 604 can be conveniently located between the A conductor 202 and the B conductor 204 such that a wave traveling on the line is predisposed to travel in a particular direction. One advantage of the present invention is that the length L of the horizontal conductors can be selected to match the propagation delays of various implementations of the regeneration elements. For example, it is well known that p-type transistors are slower than n-type transistors. Thus, if regeneration elements are implemented with n-type devices, such MOS or bipolar transistors, the length of the horizontal conductors may be smaller (L in FIG. 10A<L' in FIG. 10B) than if p-type devices are used. FIG. 10A shows the case where the regeneration elements are n-type devices, which need less time. FIG. 10B shows the case where the regeneration devices 702, 704 are p-type devices, which need relatively more time.

In either embodiment, the vertical runs of a section have a different spacing compared to the horizontal runs. If the construction of the lines is the same, this makes the $Z_0$ of a vertical run different from that of a horizontal run, causing reflections at the point of mismatch. Let the relationship between the inductances be $L_h = nL_v$ (where n is about 4, due to the enhancement) and the relationship between capacitances be $C_h = mC_v$ (where m<1 due to the relative distances), where the "h" subscript refers to a horizontal run and the "v" subscript refers to a vertical run. Then, the relationship between impedances is $Z_h = Z_v\sqrt{n/m}$, indicating the presence of a significant mismatch when m is different from n. To correct the mismatch, the relationship between the capacitances must be altered so that $C_h$ is about n times larger than $C_v$. One way to do this is to increase $C_h$ by increasing the width of the horizontal run. Another way is to decrease the width and thus the $C_v$ of the vertical run. Of course, both changes can be made as well.

Figure 11:
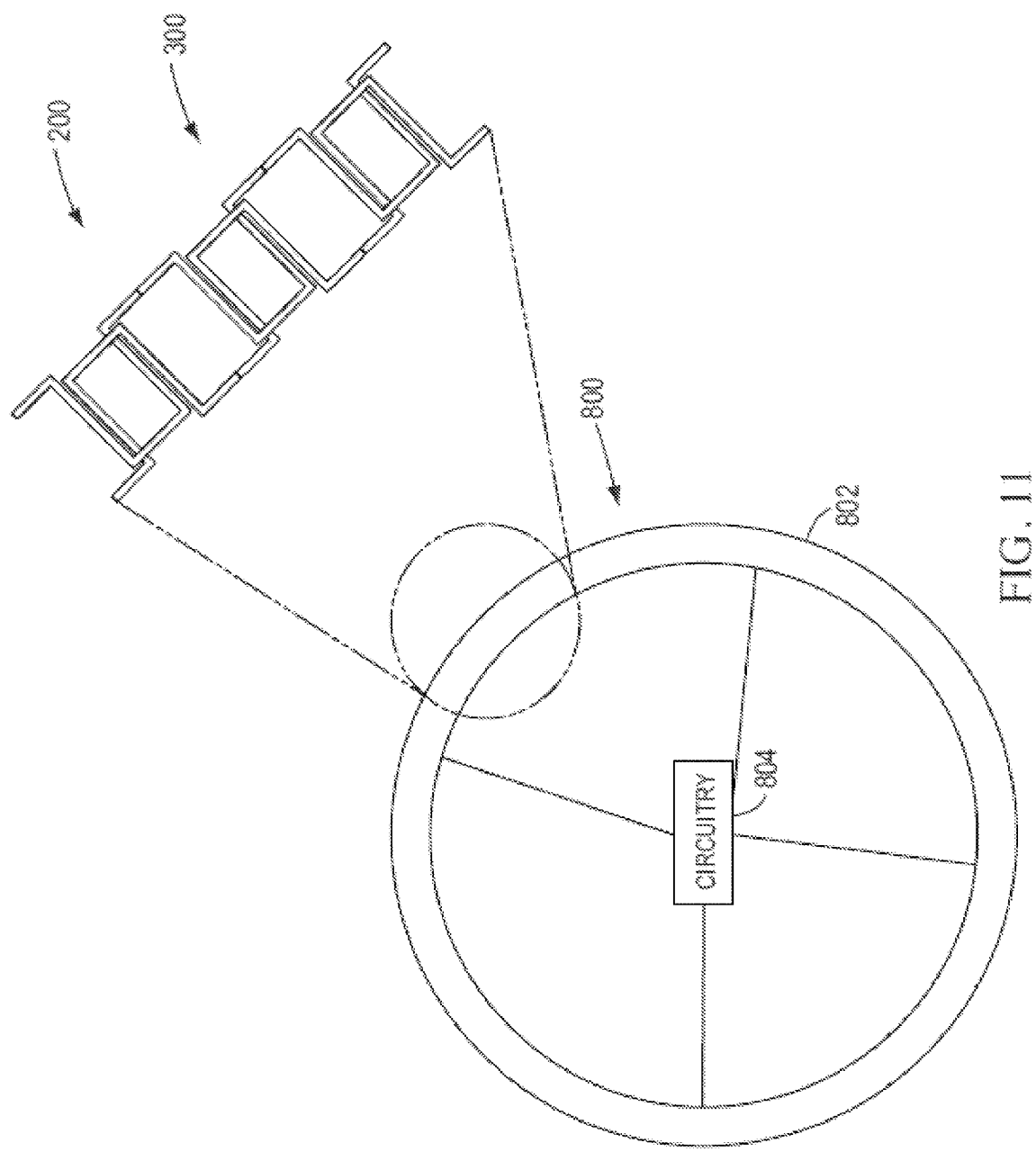
FIG. 11 shows another embodiment of the present invention in which the transmission lines of the first or second embodiment form a closed loop.

FIG. 11 shows another embodiment 800 of the present invention. In this embodiment, the top and bottom metal runs have a similar pattern to those in FIG. 6 or FIG. 7, but the vertical sides are altered so that the metal runs traverse a closed loop, such as the circle 802 shown. This arrangement permits circuitry located at or near the center of the closed loop to access more phase taps of the rotary oscillator with little or no skew, compared to other arrangements of the oscillator. Accessing more phase taps enables the circuitry to effectively operate at a higher speed compared to circuitry operating with, say, only two phases. For example, a clock operating a frequency f with N phase taps accessible permits circuitry to effectively operate at N*f.

Figure 12:
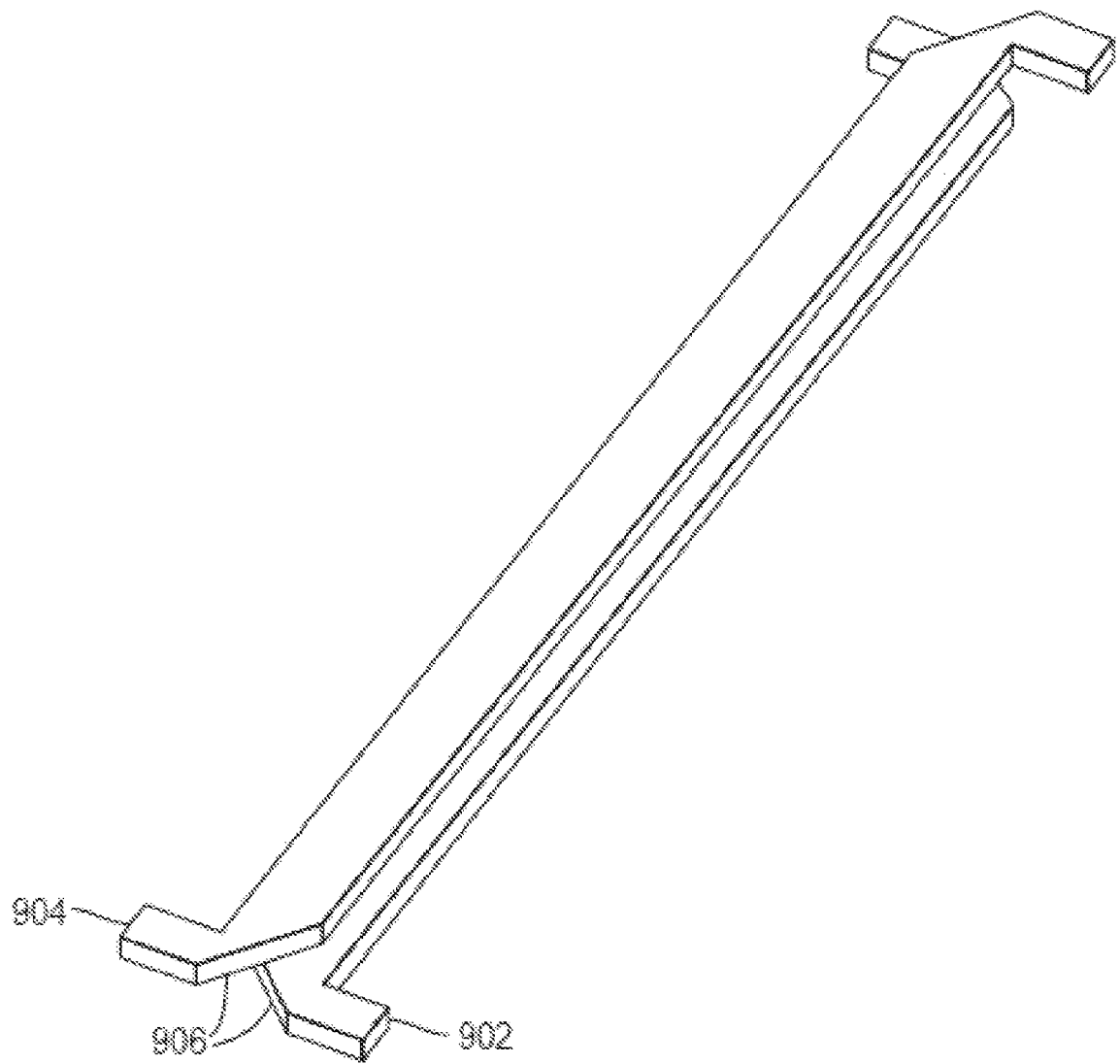
FIG. 12 shows a perspective view of a portion of the transmission line.

FIG. 12 shows a perspective view of a portion of the transmission line in which one of the metal runs overlaps the other metal run. Importantly, the width of the overlapping portion is greater than the width of the portions at right angles to the overlapping portions.

Figure 13:
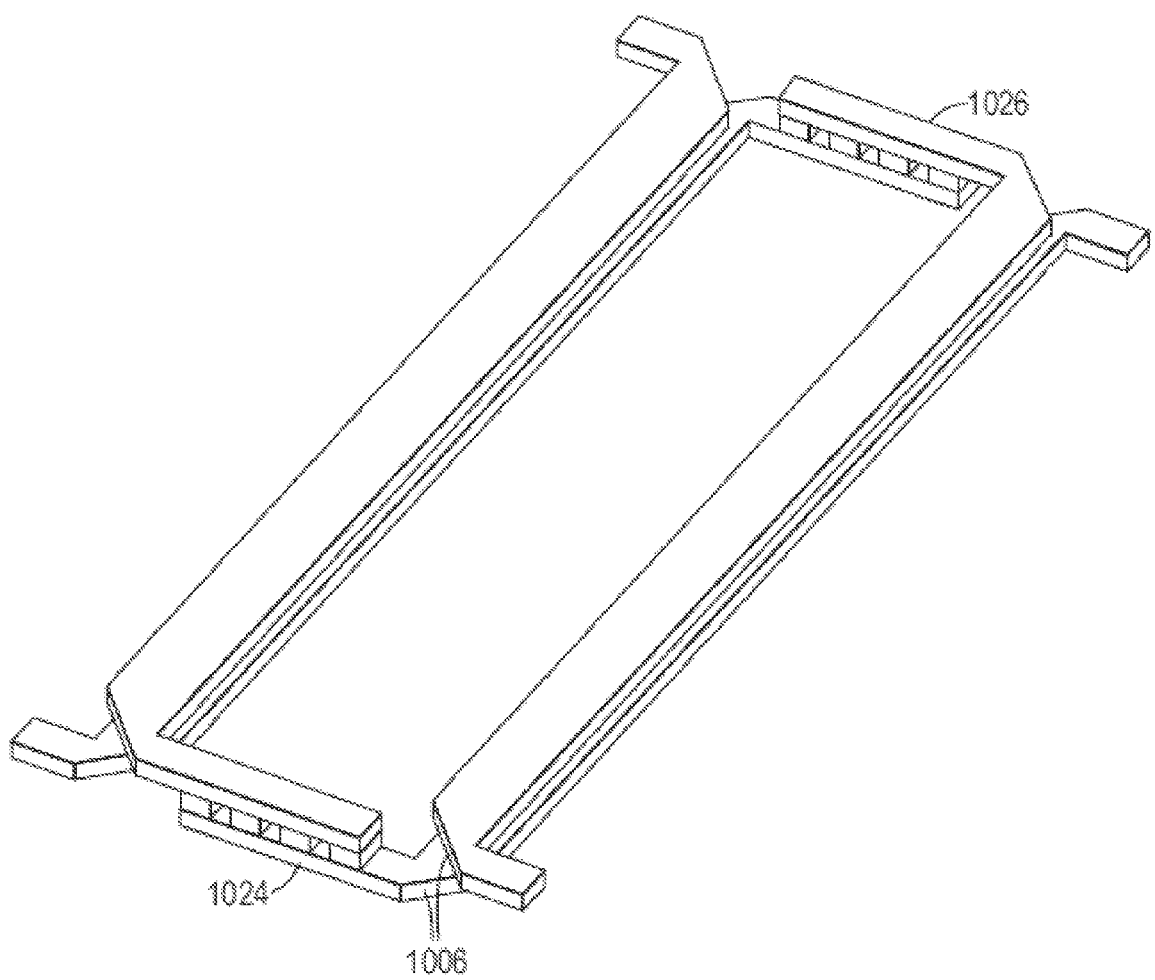
FIG. 13 shows a perspective view of a portion of the transmission line.

FIG. 13 shows a perspective view of a portion of the transmission line in which one or more feedthroughs 1024, 1026 connect the top metal run to the bottom metal run. Again, the widths of the overlapping portions are greater than those at right angles to the overlapping portions.

Multiple Oscillators

Figure 14:
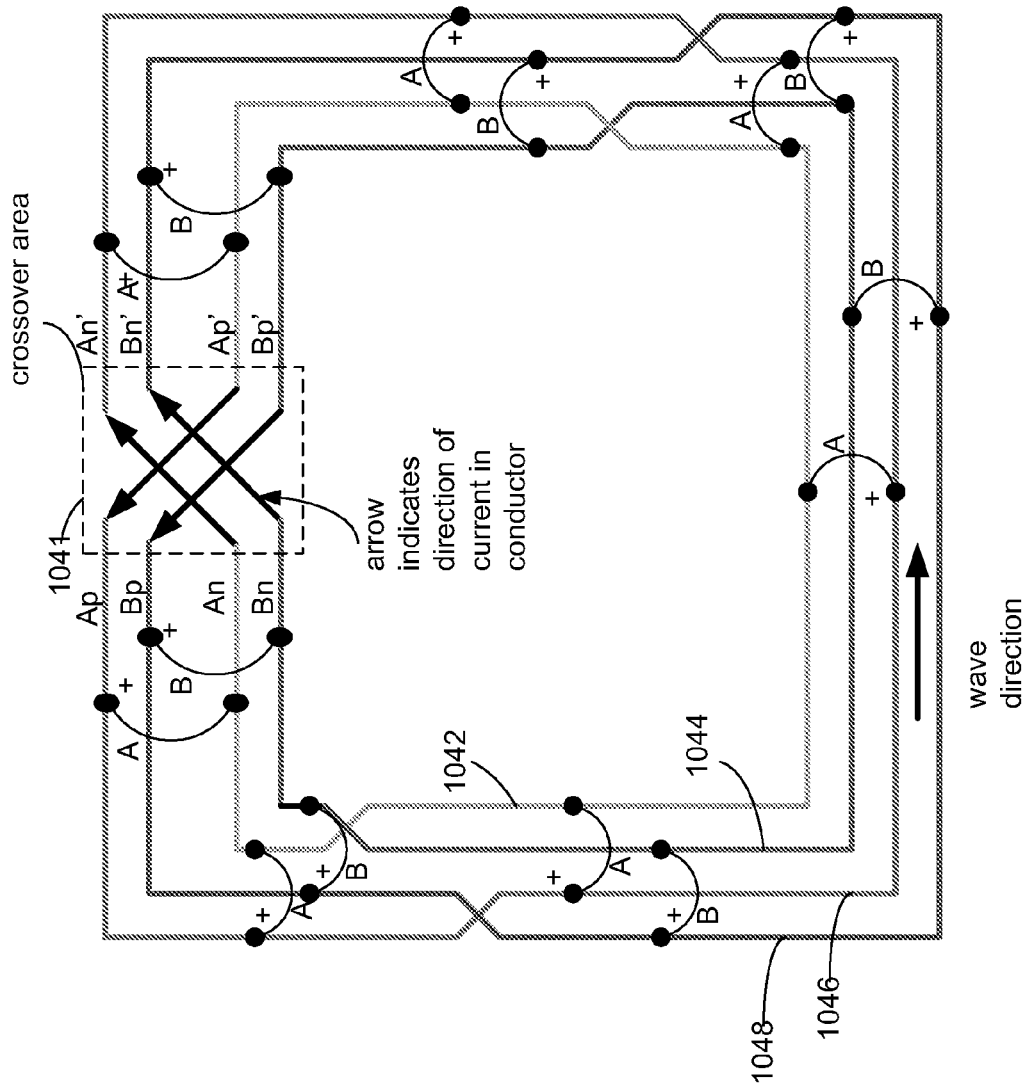
FIG. 14 shows an alternative RTWO arrangement that includes a pair of interleaved RTWOs.
Figure 15A:
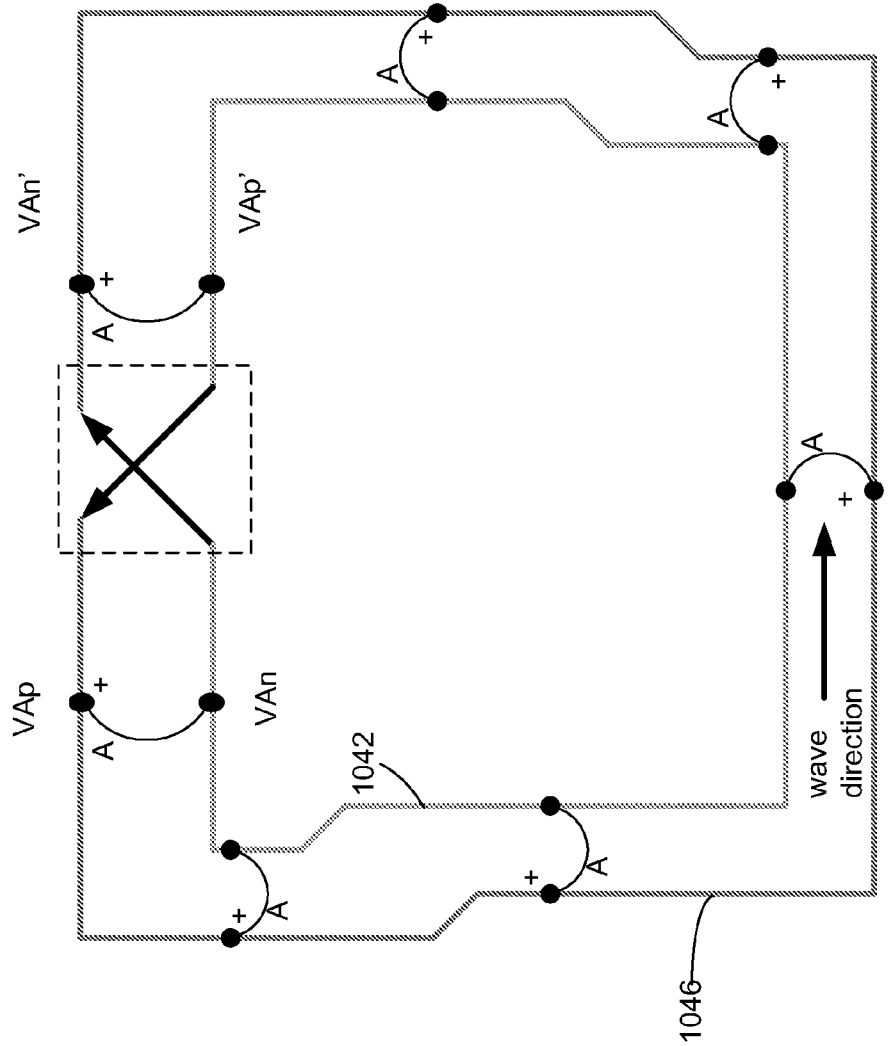
FIG. 15A shows the conductors Ap, An represented as zero thickness lines for reasons of clarity, for the first RTWO in the pair.
Figure 15B:
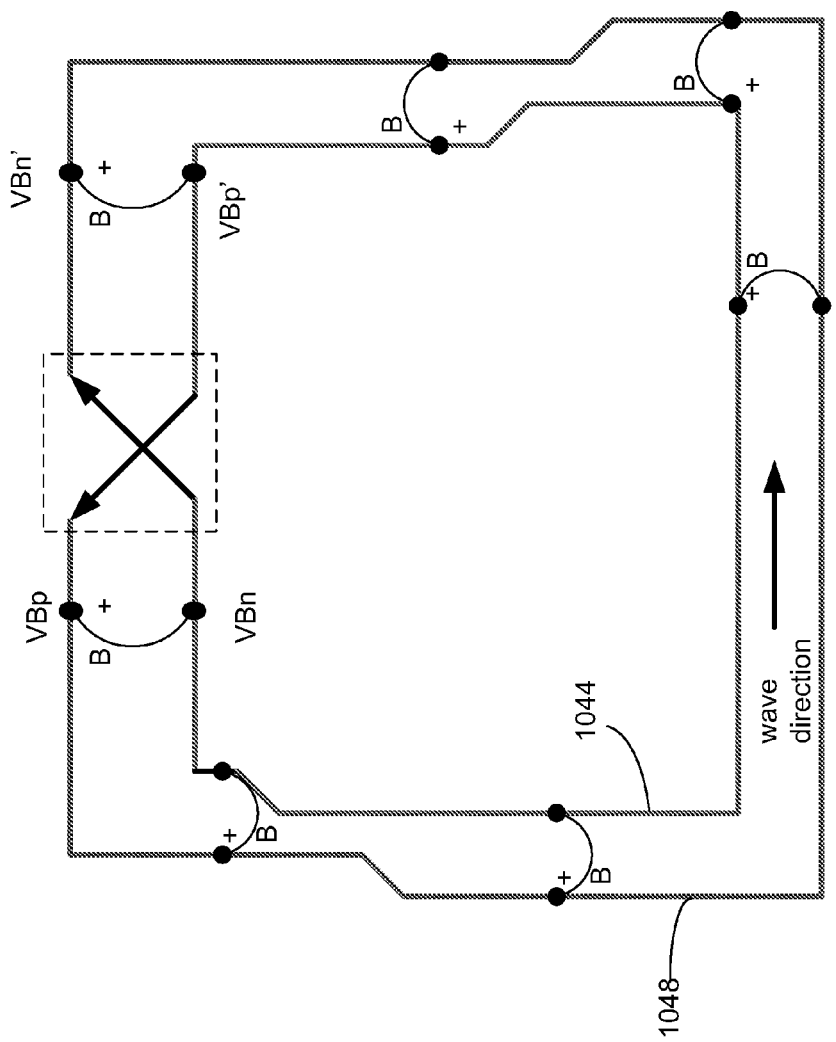
FIG. 15B shows the conductors Bp, Bn also as zero thickness lines, for the second RTWO in the pair.

Multiple RTWOs may occupy substantially the same area in accordance with FIG. 14. In this figure, two oscillators have their conductors disposed such that a length of one conductor of each oscillator is run in parallel and between the lengths of two conductors of the other oscillator. In this arrangement, the oscillators are said to be "interleaved" with each other. Other physical arrangements are possible so long as conductors of each oscillator run spaced apart by some predetermined distance and in close proximity such that they share the electromagnetic (EM) fields generated by each. It is important to note that FIG. 14 is not drawn to scale and does not depict the lengths of the conductors but only the interleaving of the two oscillators. FIG. 15A shows the first RTWO of the two oscillators in FIG. 14 with the conductors Ap 1046, An 1042 represented as zero thickness lines for reasons of clarity. FIG. 15B shows the second RTWO of the two in FIG. 14, with conductors Bp 1048, Bn 1044 also represented as zero thickness lines. In the crossover area 1041 in FIG. 14, the conductors Ap and Bp have a path that connects them with Ap' and Bp' and the conductors An and Bn have a path that connects them with An' and Bn'.

Figure 16A:
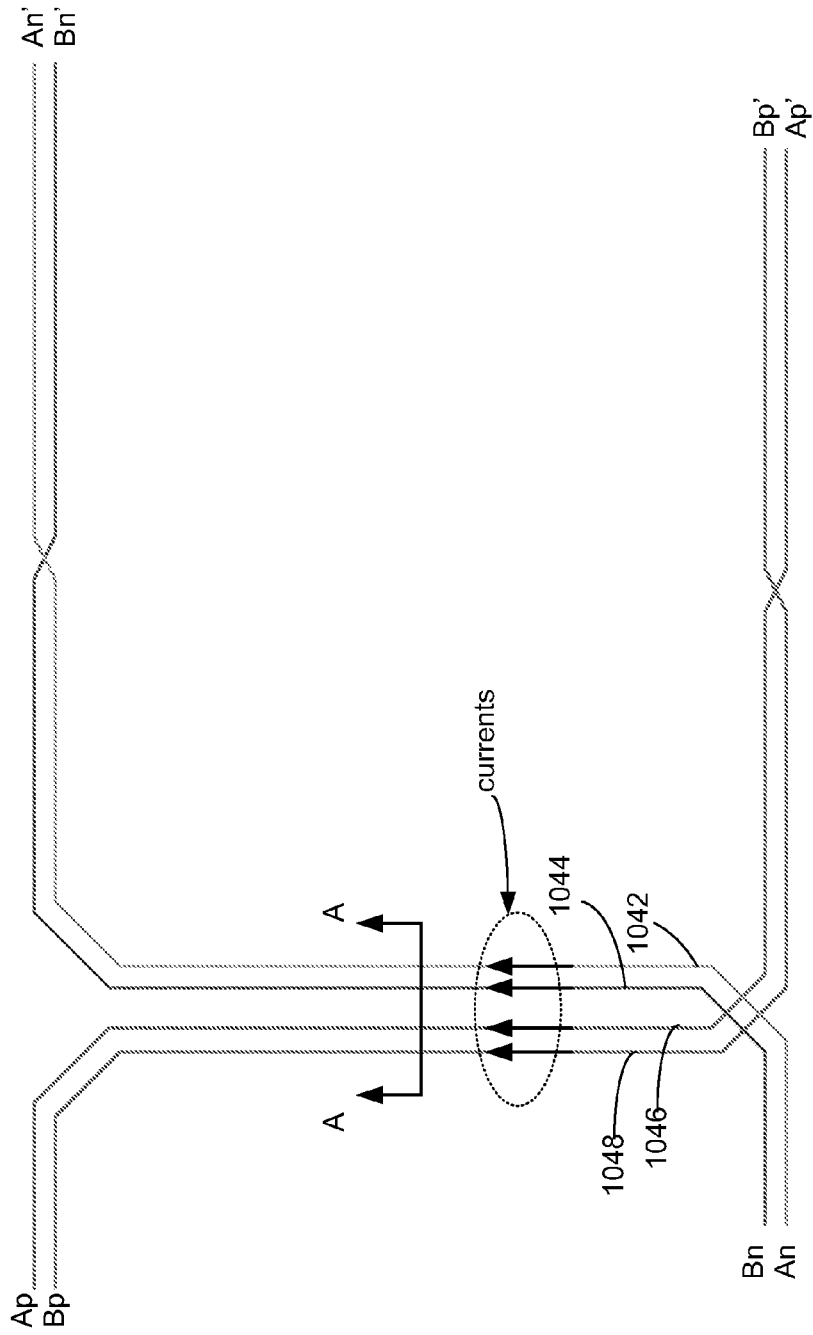
FIG. 16A shows the placement of conductors of the oscillators in a crossover area.

FIG. 16A shows a new configuration of the conductors in the crossover area 1041 for the two oscillators. In FIG. 16, the Ap 1046 conductor and An 1042 conductor run parallel with the Bp 1048 conductor and Bn 1044 conductors. In FIG. 16, the conductors in the crossover area comprise the majority of the length of the conductors of the entire oscillator, so that coupling of the conductors in the crossover area is maximized, similar to what is shown in FIG. 6 and FIG. 7. With the currents in the conductors flowing in the same direction, the resulting magnetic flux interlinks the conductors, increasing their inductance.

FIGS. 14, 15A, 15B shows the conductors as zero thickness lines for reasons of clarity, but, in practice, a conductor has some physical width w and depth d. FIGS. 16B and 16C show a cross-sectional view A-A of how the physical conductors can be arranged. In FIG. 16B, the Bp 1048 physical conductor is stacked over the Bn conductor 1044 and the Ap physical conductor 1046 is stacked over the An physical conductor 1042, with each pair stacked over a ground plane 1082. In addition, the Bp conductor 1048 and the Bn conductor 1044 are in lateral proximity with the Ap conductor 1046 and the An conductor 1042. In FIG. 16C, the conductors 1042, 1044, 1046, 1048 are all in lateral proximity to each other and stacked over a ground plane 1082.

As mentioned above, for the inductance enhancement to occur, conductor currents in the crossover area of the oscillators must flow in the same direction, which requires that the oscillators be phase locked to each other. Phase locking occurs naturally because each oscillator is naturally influenced by the other oscillators through the magnetic fields generated by the oscillators. With phase locking and each oscillator having a wave traveling in the counter-clockwise direction, the following voltage differences arise.

$$V_{An} = -V_{Ap}, \quad (1a)$$

$$V_{An'} = -V_{Ap'}, \quad (1b)$$

$$V_{Bn} = -V_{Bp}, \quad (1c)$$

$$V_{Bn'} = -V_{Bp'}. \quad (1d)$$

Furthermore, as the voltage wave travels along the pair of conductors for each oscillator, its wave front creates a voltage difference along the conductor as well, because the wave alters the voltage between the conductors. The voltage differences along a length of each conductor are:

$$V_{Ap'} = V_{Ap} + \Delta V_A \quad (2)$$

$$V_{Bp'} = V_{Bp} + \Delta V_B \quad (3),$$

where $\Delta V_A$ is the voltage difference along the Ap conductor and $\Delta V_B$ is the voltage difference along the Bp conductor. Combining the voltage differences between the conductors from Eq. (1) with Equations (2) and (3) gives:

$$V_{An'} = V_{An} - \Delta V_A \quad (4)$$

$$V_{Bn'} = V_{Bn} - \Delta V_B \quad (5),$$

which are the equations for the voltage differences across the An and Bn conductors. Equations (2), (3), (4), and (5) now imply that $$V_{Ap'} > V_{Ap}, \ V_{An} > V_{An'}, \ V_{Bp'} > V_{Bp}, \ V_{Bn} > V_{Bn'}. \quad (6)$$

Therefore, current flows from Ap' to Ap, from An to An' from Bp' to BP, and from Bn to Bn', i.e., all currents flow in the same direction, which is shown in FIG. 16A.

As described, locating the conductors next to each other as shown in FIGS. 16B and 16C increases the inductance, but the size of the increase is a strong function of the actual conductor geometry, such as w and d in FIG. 16B. The increase can range from approximately $L=L_0\sqrt{N}$ to approximately $L=L_0 N$, and any number of oscillators N can be interleaved in this fashion. As the equations indicate, the greater the number of interleaved oscillators, the greater the increase in inductance.

The increase in inductance described herein leads to an important beneficial effect—it lowers the power consumption of the oscillators. The reason is that the increase in inductance L of the conductors of each oscillator causes impedance Z encountered by wave traveling between the conductors of each oscillator to be larger, because $Z \sim \sqrt{L}$. The higher impedance lowers the current in each oscillator and thus the power P consumed by each oscillator because $P \sim V^2/Z$, where V is the magnitude of the traveling voltage wave on each oscillator and Z is the increased impedance.

However, besides lowering the power another effect occurs. Each oscillator has lower phase noise, because each of the oscillators couples to the other through a small impedance, which is the impedance of the inductive coupling described above. In the case of coupling impedance between RTWOs, the impedance is effectively absorbed into the impedance of each RTWO making the coupling impedance nearly zero. This is highly desirable because a smaller coupling impedance leads to a greater the reduction in phase noise for each oscillator, each oscillator having a greater effect in stabilizing the other oscillator or oscillators. If the coupling impedance were zero, then each oscillator would achieve a reduction in phase noise of 3 dB. Thus, the design described herein approaches this limit. As an alternative, instead of relying completely on the natural inductive coupling, a designer can force the coupling by adding electrical/metal connections, such as vias, between the oscillators.

Thus, arranging multiple oscillators as described above achieves several desirable results, (a) the oscillators become naturally phase-locked to each other; (b) the oscillators have lower power consumption, (c) the oscillators have reduced phase noise; and (d) the oscillators do not take up much more area than just a single oscillator.

Although the present invention has been described in considerable detail with reference to certain preferred versions thereof, other versions are possible. For example, at high frequencies it is important to avoid transmission imperfections that lead to reflections. One kind of imperfection occurs at right angle corners of a metal run that changes direction. At these corners the width of the metal run is greater by $\sqrt{2}$, which changes the impedance of the metal run. A better way to change direction is to convert the right angle into a rounded corner or to make two 45-degree turns. Yet another way is to remove a portion of the metal run at the corner so that the distance is the same as the rest of the run. In FIGS. 12 and 13, a portion of the corner 906, 1006 is removed to maintain the impedance relative constant over the change in direction. Therefore, the spirit and scope of the appended claims should not be limited to the description of the preferred versions contained herein.

What is claimed is:

1. Interleaved rotary traveling wave oscillators comprising:
    a first rotary traveling wave oscillator (RTWO) that includes a first pair of conductors and a first crossover, said first pair of conductors connected with the first crossover to form a first closed loop; and
    a second rotary traveling wave oscillator (RTWO) that includes a second pair of conductors and a second crossover, said second pair of conductors connected with the second crossover to form a second closed loop;
    wherein the second closed loop occupies approximately the same physical area as the first closed loop; and
    wherein the conductors of said first and second crossovers are spaced apart and parallel to each other over a sufficient length that the inductance of the crossovers is increased,
    wherein the first and second pairs of conductors are interleaved such that the first and second RTWOs are coupled to one another by magnetic fields.

2. The interleaved oscillators of claim 1,
    wherein a first conductor of the first pair of conductors and a first conductor of the second pair of conductors are immediately adjacent, and
    wherein a second conductor of the first pair of conductors and a second conductor of a second pair of conductors are immediately adjacent.

3. The interleaved oscillators of claim 1, wherein the first and second RTWOs are coupled to each other through an impedance such that each RTWO has reduced phase noise.

4. The interleaved oscillators of claim 3, wherein the coupling impedance is inductive.

5. The interleaved oscillators of claim 3, wherein the coupling impedance is resistive.

6. The interleaved oscillators of claim 1, wherein the first and second RTWOs are coupled to each other through an impedance such that each is phase locked with the other.

7. Interleaved rotary traveling wave oscillators comprising:
    a first rotary traveling wave oscillator (RTWO) that includes a first pair of conductors and a first crossover, said first pair of conductors connected with the first crossover to form a first closed loop; and
    a second rotary traveling wave oscillator (RTWO) that includes a second pair of conductors and a second crossover, said second pair of conductors connected with the second crossover to form a second closed loop;
    wherein the second closed loop occupies approximately the same physical area as the first closed loop; and
    wherein the conductors of said first and second crossovers are spaced apart and parallel to each other over a sufficient length that the inductance of the crossovers is increased,
    wherein any currents flowing in the parallel conductors of the crossovers flow in the same direction.

8. Interleaved rotary traveling wave oscillators comprising:
    a first rotary traveling wave oscillator (RTWO) that includes a first pair of conductors and a first crossover, said first pair of conductors connected with the first crossover to form a first closed loop; and
    a second rotary traveling wave oscillator (RTWO) that includes a second pair of conductors and a second crossover, said second pair of conductors connected with the second crossover to form a second closed loop;
    wherein the second closed loop occupies approximately the same physical area as the first closed loop; and
    wherein the conductors of said first and second crossovers are spaced apart and parallel to each other over a sufficient length that the inductance of the crossovers is increased,
    wherein the conductors of the first and second crossovers are disposed over a ground plane and laterally adjacent to each other.

9. The interleaved oscillators of claim 8,
    wherein the conductors of the first crossover are stacked over each other and together disposed over the ground plane; and
    wherein the conductors of the second crossover are stacked over each other and together disposed over the ground plane.

10. An integrated circuit comprising:
    a first rotary traveling wave oscillator (RTWO) including a first pair of conductors and a first crossover, wherein the first pair of conductors is connected with the first crossover to form a first closed loop; and
    a second RTWO including a second pair of conductors and a second crossover, wherein the second pair of conductors is connected with the second crossover to form a second closed loop,
    wherein the second closed loop occupies substantially the same area as the first closed loop, and
    wherein the first and second pairs of conductors are interleaved such that they share electro-magnetic (EM) fields generated by each other.

11. The integrated circuit of claim 10,
    wherein a first conductor of the first pair of conductors and a first conductor of the second pair of conductors are immediately adjacent, and wherein a second conductor of the first pair of conductors and a second conductor of a second pair of conductors are immediately adjacent.

12. The integrated circuit of claim 11, wherein the first conductor of the second pair of conductors runs in parallel with and between the first pair of conductors in a portion of the first closed loop, and wherein the first conductor of the first pair of conductors runs in parallel with and between the second pair of conductors in a portion of the second closed loop.

13. The integrated circuit of claim 10, wherein a first conductor of the first crossover runs in parallel with a first conductor of the second crossover, and wherein a second conductor of the first crossover runs in parallel with a second conductor of the second crossover, wherein any currents in the first and second conductors of the first crossover and in the first and second conductors of the second crossover flow in the same direction.

14. The integrated circuit of claim 13,
wherein the first and second conductors of the first crossover are stacked over each other and together disposed over a ground plane,
wherein the first and second conductors of the second crossover are stacked over each other and together disposed over the ground plane, and
wherein the first and second conductors of the first crossover and the first and second conductors of the second crossover are laterally adjacent to each other.

15. The integrated circuit of claim 13, wherein the first conductor of the first crossover is laterally adjacent to and disposed between the first and second conductors of the second crossover, wherein the first conductor of the second crossover is laterally adjacent to and disposed between the first and second conductors of the first crossover, and wherein the first and second conductors of the first crossover and the first and second conductors of the second crossover are disposed over a ground plane.

16. The integrated circuit of claim 10, wherein the first and second RTWOs are coupled to each other through an impedance.

17. The integrated circuit of claim 16, wherein the coupling impedance is inductive.

18. The integrated circuit of claim 16, wherein the coupling impedance is resistive.

19. A method of generating a plurality of traveling waves, the method comprising:
generating a first traveling wave using a first rotary traveling wave oscillator (RTWO), wherein the first RTWO includes a first pair of conductors and a first crossover, wherein the first pair of conductors is connected with the first crossover to form a first closed loop; and
generating a second traveling wave using a second RTWO, wherein the second RTWO includes a second pair of conductors and a second crossover, wherein the second pair of conductors is connected with the second crossover to form a second closed loop, wherein the second closed loop occupies substantially the same area as the first closed loop,
wherein the first and second pair of conductors are interleaved such that they share electro-magnetic (EM) fields generated by each other.

20. The method of claim 19, wherein generating the first and second traveling waves comprises phase locking the first and second RTWOs.

* * * * *